United States Patent [19]

Enomoto et al.

[11] Patent Number: 5,087,433
[45] Date of Patent: Feb. 11, 1992

[54] METHOD AND APPARATUS FOR THE PRODUCTION OF SIC WHISKER

[75] Inventors: Ryo Enomoto; Yoshimi Matsuno, both of Gifu, Japan

[73] Assignee: Ibiden Co., Ltd., Ogaki, Japan

[21] Appl. No.: 622,375

[22] Filed: Dec. 5, 1990

Related U.S. Application Data

[63] Continuation of Ser. No. 269,741, filed as PCT/JP88/00175, Feb. 19, 1988, abandoned.

[30] Foreign Application Priority Data

Feb. 20, 1987 [JP] Japan .................................. 62-35761
Jun. 23, 1987 [JP] Japan ................................ 62-154447

[51] Int. Cl.$^5$ .................... C01B 21/068; C30B 29/062
[52] U.S. Cl. ...................................... 423/346; 423/345
[58] Field of Search .............................. 423/345, 346

[56] References Cited

U.S. PATENT DOCUMENTS

| 3,209,981 | 1/1973 | Lee et al. | 423/346 |
| 3,933,984 | 1/1976 | Kimura et al. | 423/345 |
| 4,552,740 | 11/1985 | Morgan et al. | 423/346 |
| 4,640,830 | 2/1987 | Arakawa | 423/346 |
| 4,789,537 | 12/1988 | Shalek et al. | 423/346 |
| 4,855,119 | 8/1989 | Minamikata et al. | 423/346 |

FOREIGN PATENT DOCUMENTS

| 57-123813 | 8/1982 | Japan . | |
| 57-209813 | 12/1982 | Japan . | |
| 58-49697 | 3/1984 | Japan . | |
| 63-79798 | 9/1986 | Japan | 423/346 |
| 61-227993 | 10/1986 | Japan . | |
| 61-227999 | 10/1986 | Japan . | |

Primary Examiner—Olik Chaudhuri
Assistant Examiner—Ken Horton
Attorney, Agent, or Firm—Dvorak and Traub

[57] ABSTRACT

In the production of SiC whisker for composite materials such as FRP, FRM, FRC and the like by vapor phase synthesis between silicon sulfide and carbon compound, SiC whisker suitable for the continuation and mass production is produced in industrial scale by using metallic Si as a starting material through a stage of contacting the metallic silicon with hydrogen sulfide gas to produce silicon sulfide gas, and a stage of contacting the silicon sulfide gas with carbon compound and, if necessary, a formed nucleus to deposit and grow whisker.

1 Claim, 4 Drawing Sheets

FIG_1

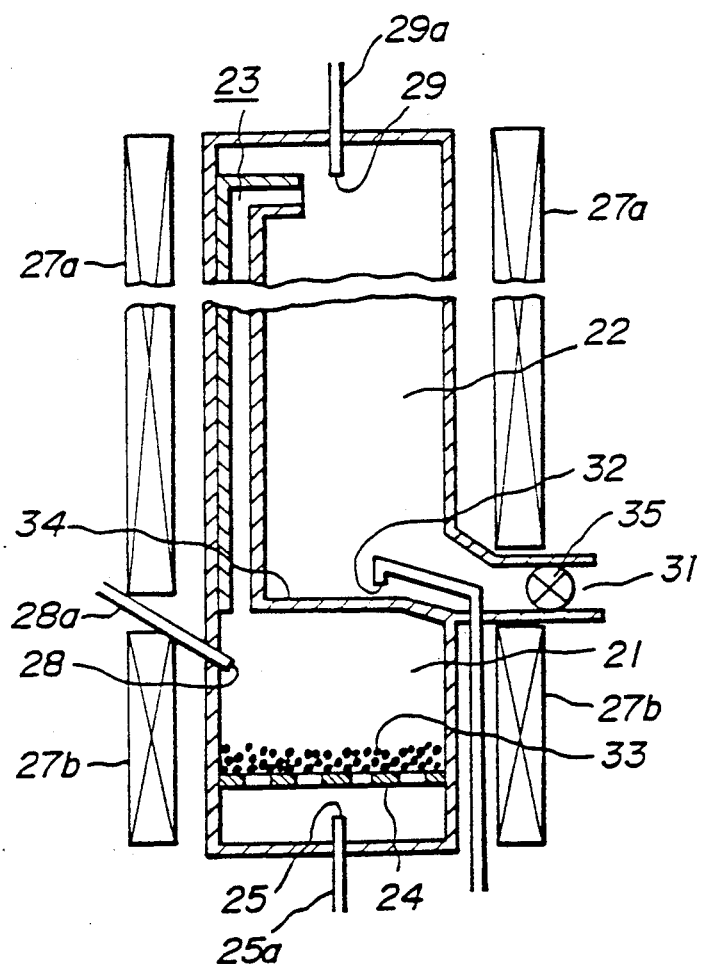
FIG_6

METHOD AND APPARATUS FOR THE PRODUCTION OF SIC WHISKER

This application is a continuation of application Ser. No. 269,741, filed as PCT/JP88/00175, Feb. 19, 1988, now abandoned.

TECHNICAL FIELD

This invention relates to a method and an apparatus for the production of SiC whisker, and more particularly it proposes a method and an apparatus for continuously and efficiently producing a high quality SiC whisker, which is used as a composite material such as fiber reinforced plastic, fiber reinforced metal, fiber reinforced ceramic or the like, in industrial scale through vapor process.

BACKGROUND ART

As the presently known method for the production of SiC whisker, there are a solid phase process using solid starting materials of carbon and silicon, and a vapor phase process using gases of carbon and silicon or reaction of solid therewith or a mixed gas.

The solid phase process is a method of leading the following reactions from solid $SiO_2$ and C;

$$SiO_2 + C \rightleftharpoons SiO + CO$$

$$SiO + 3CO \rightleftharpoons SiC + 2CO_2$$

$$CO_2 + C \rightleftharpoons 2CO$$

and is a technique in which so-called gaseous SiO and CO produced are reacted to deposit and grow SiC whisker.

For example, the technique disclosed in Japanese Patent Application Publication No. 59-9516 belonging to such a solid phase process is a method wherein incinerated chaffs are used as Si source and carbon black is used as C source and both materials are heated in a range of 1300° to 1700° C. in a non-oxidizing atmosphere.

Furthermore, in the technique disclosed in Japanese Patent laid open No. 61-227993, there is proposed a method wherein anhydrous silicic acid is used as Si source and activated carbon is used as C source and both are heated at a temperature in the range of 1400° to 1700° C. in a non-oxidizing atmosphere.

As the apparatus used for carrying out the above solid phase process, for instance, a raction vessel for the production of SiC whisker made of a graphite is disclosed in Japanese Utility Model Application Publication No. 59-38447, and Japanese Patent laid open No. 61-227999 proposes an apparatus for the production of SiC whisker comprising a furnace body provided in its longitudinal direction with a passage having a temperature gradient, and a plurality of sample housing vessels having a starting material filling zone arranged along the passage, a whisker producing zone and an exhaust tube.

On the other hand, as the vapor phase process, there are known a method wherein a halogenated silicon such as gaseous silicon tetrachloride or the like as Si source and a gaseous carbon compound such as carbon tetrachloride or the like are reacted at a high temperature in a stream of hydrogen, a method by thermal decomposition of an organic silane such as methyltrichloro silane, and the like. For instance, the technique disclosed in Japanese Patent Application Publication No. 59-45635 is a method wherein a halogenated silicon gas and a halogenated carbon gas are introduced into a heating reaction tube through a carrier gas ($H_2$) and then β-SiC whisker is grown on a SiC or SiC-containing bottomed cylindrical substrate provided with plural slits, while Japanese Patent Application Publication No. 59-45636 proposes a method wherein a porcelain tube or a graphite tube filled with carbon powder is inserted into an outer sleeve and heated at 1300° C. to generate a mixed gas of silicon tetrachloride and hydrogen to thereby produce SiC whisker.

The above two techniques as the solid phase process have the following problems:

(1) Not only a large amount of granular SiC is by-produced, but also the granules of the unreacted starting material remain, which are included in the resulting SiC whisker, so that it is impossible to obtain high-purity whisker suitable as a reinforcing material for metal or ceramics. Therefore, it is required to take complicated steps for depositing and refining these granules, and the yield of the whisker is low;

(2) Since the reaction rate is slow, it is difficult to largely and continuously produce whiskers having a high aspect ratio; and (3) The reaction temperature is high.

Furthermore, all of the apparatuses using such a solid phase process are batch type, so that not only the continuous production is impossible, but also in order to conduct the efficient mass production, many reaction vessels should be used. Therefore, large-scaling of the apparatus comes into problem.

On the other hand, the above conventional techniques as the vapor phase process have a problem that the halogenated silicon as a starting material is expensive. And also, in these conventional techniques, there is no concrete disclosure nor suggestion on a continuous production means in industrial scale.

An object of the invention is to develop a technique which can overcome the problems in each of the above solid phase process and vapor phase process.

DISCLOSURE OF THE INVENTION

As a method for efficiently producing high purity SiC whisker suitable as a reinforcing material in industrial scale, the invention firstly provides a method for producing SiC whisker by vapor phase synthesis of silicon sulfide and carbon compound, characterized in that metallic silicon granules are charged into a silicon sulfide gas producing region held in a temperature atmosphere range of 1000° to 1400° C. and at the same time a hydrogen sulfide gas is introduced into this region to generate silicon sulfide gas, and then the resulting silicon sulfide gas is introduced into a whisker synthesis region held in a temperature atmosphere range of 1130° to 1500° C. and contacted with a carbon compound to deposit and grow a whisker, and then the whisker is discharged therefrom after the growth to a given size.

As the method for concretely carrying out the above first method, the invention secondly provides a method for producing SiC whisker by vapor phase synthesis of silicon sulfide and carbon compound, characterized in that metallic silicon granules are successively charged into a silicon sulfide producing vessel provided with an outlet for production gas and an inlet for reaction gas, and while said metallic silicon granules are held in a temperature atmosphere range of 1000° to 1400° C. in said silicon sulfide producing vessel, a hydrogen sulfide gas is blown into a lower portion of said vessel together with a carrier gas to generate a silicon sulfide gas which is discharged from an upper portion thereof, and then the continuously produced silicon sulfide gas is introduced into a whisker synthesis vessel maintained at a temperature range of 1130° to 1500° C. together with a carrier gas to contact with a carbon compound in the presence of the produced nucleus, whereby a whisker is deposited and subsequently grown and then continuously or intermittently discharged after the growth to a given size, and thirdly provides a method for producing SiC whisker by vapor phase synthesis of silicon sulfide and carbon compound, characterized in that a gas containing hydrogen sulfide is introduced into a silicon sulfide producing chamber maintained at a temperature range of 1000° to 1400° C. and contacted and reacted with a metallic silicon filled in said chamber to generate a silicon sulfide gas, and then the produced silicon sulfide gas held at a temperature above 1000° C. is transferred to a SiC whisker synthesis chamber maintained at a temperature range of 1130° to 1500° C. and contacted with a carbon compound therein to deposit and grow SiC whisker, which is continuously or intermittently discharged from the lower portion thereof.

Further, as the apparatus directly used for practicing the above second and third methods, the invention firstly provides an apparatus for the production of SiC whisker, characterized in that a silicon sulfide producing vessel comprising a vessel body provided with a heating equipment, a gas distributing plate arranged near to the bottom of the body, an inlet for a starting material arranged in an upper wall portion of the gas distributing plate, an outlet for a product gas arranged at a top thereof and inlets for reaction gas and carrier gas arranged in the bottom of said distributing plate is connected to a whisker synthesis vessel comprising a vessel body provided with a heating equipment, pipes for the supply of nucleus forming material and the supply of a carbon compound arranged therein and an outlet for the discharge of whisker arranged in the bottom thereof through a transferring tube provided with a heating equipment;

and secondly provides an apparatus for the production of SiC whisker, characterized in that the interior of said vessel is divided into a silicon sulfide gas producing chamber and a SiC whisker synthesis chamber, and the both chambers are communicated with each other through a gas transferring passage and made of a cylindrical reaction vessel provided with a heating equipment, and further a distributing plate is arranged in said silicon sulfide gas producing chamber, and a gas inlet for the introduction of hydrogen sulfide containing gas is arranged beneath said distributing plate and an inlet for the supply of metallic silicon is arranged above said distributing plate, and said SiC whisker synthesis chamber is provided with an inlet for the supply of carbon compound, an outlet for whisker and a gas discharge port.

BRIEF DESCRIPTION OF THE DRAWINGS

FIGS. 1 to 6 are sectional views showing preferable embodiments of the apparatus for the production of SiC whisker according to the invention, respectively;

FIG. 1 is a view of an embodiment wherein the silicon sulfide producing vessel and the whisker synthesis vessel are arranged as a separate member;

FIG. 2 is a view of an embodiment wherein the gas inlet and the inlet for the supply of the starting material are arranged from the upper side;

FIG. 3 is a view of an embodiment wherein the inlet for the supply of nucleus forming material is arranged and the gas inlet and the inlet for the supply of carbon compound are arranged at side portion;

FIG. 4 is a view of an embodiment wherein the gas transferring passage is arranged in the peripheral portion;

FIG. 5 is a view of an embodiment wherein the gas inlet and the inlet for the supply of carbon compound are arranged from the bottom of the vessel; and FIG. 6 is a view of an embodiment arranging SiC whisker synthesis chamber in the upper portion and the silicon sulfide gas producing chamber in the lower portion.

BEST MODE FOR CARRYING OUT THE INVENTION

The fundamental principle of the idea according to the invention lies in that the metallic silicon is contacted with a mixed gas of hydrogen sulfide-hydrogen to produce silicon sulfide gas, which is then reacted with propylene gas ($C_3H_6$) to produce SiC whisker. As to such an idea, there is known "EGASHIRA et al" study confirmed in laboratory as a vapor phase synthesis method of whisker [Reference article: M. EGASHIRA, H. KATSUKI, M. MORI, H. KANEKO, W. KURAHASHI, S. KAWAZUMI, Yogyo Kyokai-shi, 93. 535 to 540 (1985)]. According to this study, the above method is considered to be based on the following reaction:

Total reaction formula:

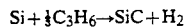
$$Si + \tfrac{1}{3}C_3H_6 \rightarrow SiC + H_2$$

(1) when SiS is an intermediate:

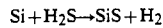
$$Si + H_2S \rightarrow SiS + H_2$$

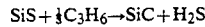
$$SiS + \tfrac{1}{3}C_3H_6 \rightarrow SiC + H_2S$$

(2) when $SiS_2$ is an intermediate:

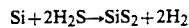
$$Si + 2H_2S \rightarrow SiS_2 + 2H_2$$

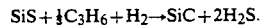
$$SiS + \tfrac{1}{3}C_3H_6 + H_2 \rightarrow SiC + 2H_2S.$$

The known method according to this deskwork experiment has excellent features that ①the whisker having a large aspect ratio is obtained, ②the starting material is cheap, ③the growing rate of whisker is fast, and ④high purity whisker is produced without including granules, and the like as compared with the aforementioned conventional techniques.

However, as described in the above "reference article", this method is concerned with a study based on batch type using a small size tubular furnace, which does not technically disclose the concrete means for continuous mass production inevitable in industrialization and is considered to be unsuitable for continuous mass production owing to various restrictions. The inventors have made further studies based on the fundamental principle shown in the above reference article, and found that the aforementioned various problems of the conventional techniques are overcome by adopting a method wherein a series of production steps are separated into a step of generating silicon sulfide gas and a step of depositing and growing SiC whisker and a reaction region corresponding to each step is defined and a gas transferring passage is arranged between these defined regions so as to communicate them to each other for facilitating the handling of intermediate reaction product, and as a result a technique of continuously and efficiently producing high quality whisker in industrial scale has been accomplished. The invention will be described in detail with reference to the accompanying drawings.

The method of the invention consists of a first stage for generating silicon sulfide gas and a second stage for depositing SiC whisker from the silicon sulfide gas.

Figure 1:
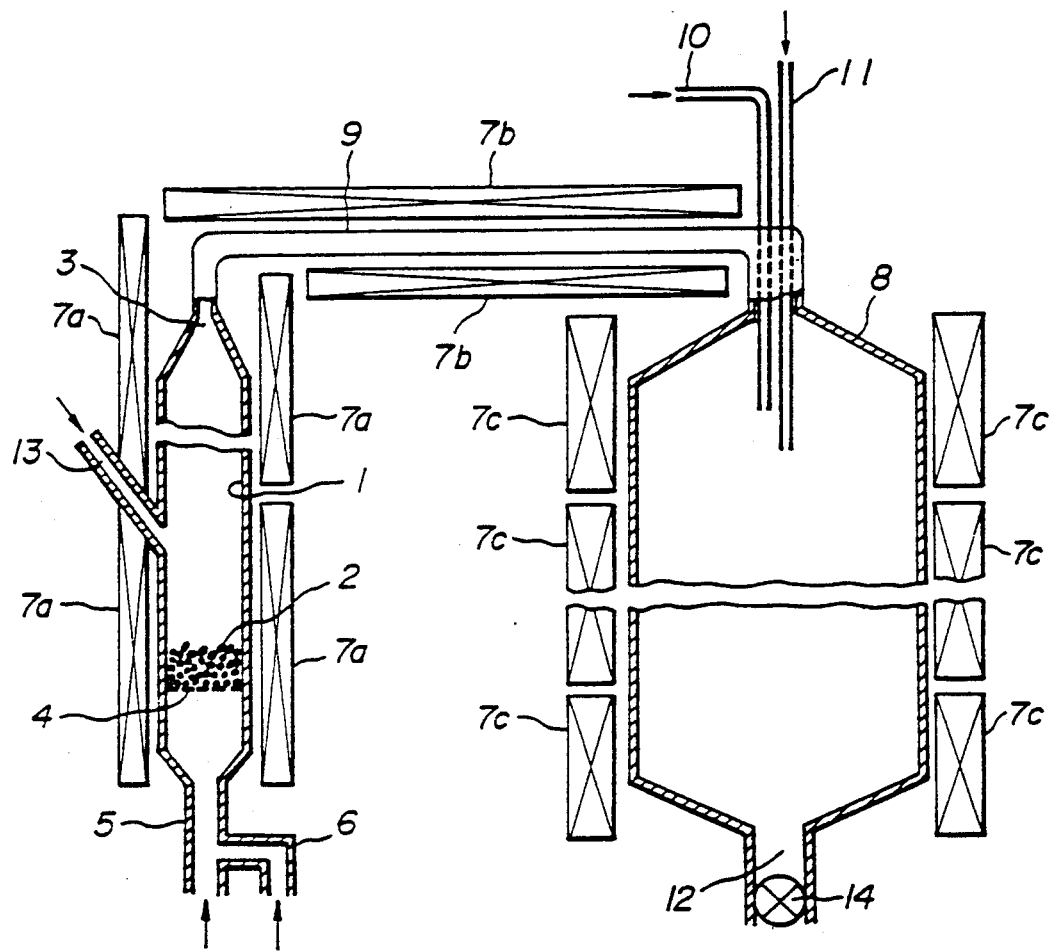

For instance, the first stage is explained with respect to a case of using an apparatus shown in FIG. 1. At first, a metallic silicon 2 as a starting material is continuously or intermittently supplied to a lower portion of a preliminary fluidized reaction vessel 1 for the production of silicon sulfide. The preliminary fluidized reaction vessel 1 for the production of silicon sulfide is provided at its upper portion with a discharge port 3 for a produced gas and at its lower portion with an inlet 5 for a reaction gas and an inlet 6 for a carrier gas. A gas distributing plate 4 having many gas blowing ports is arranged above each of these gas inlets 5, 6. The metallic silicon 2 is charged and held on the gas distributing plate 4.

Moreover, an inlet 13 for supplying the metallic silicon as a starting material is arranged in the sidewall of the preliminary fluidized reaction vessel 1, from which metallic silicon having a particle size of not more than 2 mm is supplied. When using coarse powder with a particle size exceeding the above value, the reaction efficiency becomes poor. On the other hand, when the particle size is less than 0.04 mm, there is a possibility that the fine powder is entered with the resulting gas from the gas discharge port 3, so that it is desirable to use metallic silicon having a particle size of 0.04 to 2 mm. As a material of the reaction vessel, it is desired to use a heat resistant material such as alumina, mullite, silicon carbide or the like because the inside of the vessel becomes high temperature of not lower than 1000° C.

After the supply of the metallic silicon as a starting material, a hydrogen sulfide gas and a carrier gas ($H_2$) are introduced from the gas inlets 5, 6 of the preliminary reaction vessel at a mixed state and catalytically reacted with the metallic silicon 2 to generate silicon sulfide gas, which is discharged from the discharge port 3 arranged at the top of the preliminary reaction vessel 1 through the carrier gas and then transferred to a subsequent fluidized main reaction vessel 8 at a warmed state.

In order to generate the silicon sulfide gas in the preliminary reaction vessel 1 of the first stage, it is necessary to hold the inside of the vessel above 1000° C., and further it is desirable to hold the inside of the vessel at a temperature of not lower than 1130° C. being a boiling point of silicon disulfide. Since the melting point of the metallic silicon is 1414° C., however, the metallic silicon melts at a temperature above the melting point, so that the temperature inside the vessel is desirable to maintain within a range of 1000° to 1400° C. Therefore, it is necessary to arrange a heating means 7a, 7b such as an electric furnace or the like in the preliminary reaction vessel 1 and a transport pipe 9 for transferring the silicon sulfide gas so as to hold the inside temperature within a range of 1000° to 1400° C.

As the carrier gas, use may be made of an inert gas such as argon, helium or the like; a reducing gas such as hydrogen or the like; and a mixed gas thereof. When such a gas is blown together with the hydrogen sulfide gas into the vessel, it is desirable that the operation is carried out so as to gradually change the metallic silicon charged into the vessel from a first fixed layer to a fluidized layer because the fluidization state is desirable in view of the reaction efficiency. Moreover, it is not preferable that the metallic silicon particles scatter off from the gas discharge port together with the blowing gas. For this end, in order to efficiently generate the silicon sulfide gas, it is desirable to adjust the gas flow rate beneath the porous gas distributing plate 4 holding the metallic silicon thereon. The degree of such adjustment is different in accordance with the particle size of metallic silicon, but it is desirable that the gas flow rate is not more than 10 times of a rate causing the fluidization of the metallic silicon layer. If the gas flow rate exceeds the above, there is a high possibility that the metallic silicon particles scatter from the gas discharge port.

The second stage of the invention is a step that the silicon sulfide gas produced at the first stage is introduced into a fluidized main reaction vessel for the synthesis of whisker, an inner temperature of which being held at 1130° to 1500° C. through heating equipment 7c, together with the carrier gas, while a carbon compound and a nucleus forming material are introduced thereinto through a pipe 10 for the supply of the carbon compound and a pipe 11 for the supply of the nucleus forming material to thereby deposit and grow whiskers in the reaction vessel 8.

As the carbon compound, use may be made of paraffinic hydrocarbons such as methane, ethane, propane, butane, pentane and so on; olefin hydrocarbons such as ethylene, propylene, butylene, amylene and so on; acetylenic hydrocarbons such as acetylene, allylene, butyine and so on; aromatic hydrocarbons such as benzene, naphthalene, antracene and so on; alicyclic hydrocarbons such as cycloparaffin, cycloolefin and so on; and a mixture of these compounds. These carbon compounds may be supplied in form of liquid or solid. In case of the liquid or solid at room temperature, it is desirable that they are changed into fine particles and rendered into a slurry with water or an organic solvent, or a state dispersing in the carrier gas, or a solution dissolved in an organic solvent, or further a gas modified by heating in view of the handling.

Moreover, the carbon compound used in the invention is possible to be selected from the kind and form as mentioned above over a wide range, but it is desirable to use methane, ethane, propane, ethylene, propylene, acetylene, allylene and the like from viewpoints of reaction efficiency, yield of whisker, easiness of handling and the like.

On the other hand, as the nucleus forming material, use may be made of metals such as iron, nickel, titanium, manganese, cobalt, copper, vanadium, chromium, aluminum, silicon and so on; inorganic substances such as oxides, carbides, nitrides, sulfides, halides, sulfates, nitrates and so on of the above metals; metal alcoholates such as ethly silicate, ethyl titanate and son; organic metal compounds such as metalocene represented by $M(C_2H_5)_2$ [M: Fe, Ni, Ti, Mn, Co, Cu, V, Cr] and so on; and a mixture thereof. Such a nucleus forming material may be supplied in form of gas, liquid or solid. In case of the liquid or solid at room temperature, it is desirable that they are changed into fine particles and rendered into a slurry with water or an organic solvent, or a state dispersing in the carrier gas, or a solution dissolved in an organic solvent, or further a gas modified by heating in view of the handling.

As mentioned above, the nucleus forming material used in the invention is possible to be selected from the aforementioned kind and form over a wide range, but it is desirable to use the organic metal compound of iron, nickel, manganese and so on from viewpoints of reaction efficiency, yield of whisker, easiness of handling, easiness for the removal of the formed nucelus after the synthesis of whisker and the like.

At the stage using the main reaction vessel 8, in order to synthesize SiC whisker by the reaction between silicon sulfide gas and carbon compound, it is necessary to react both the substances at a gaseous state. From this fact, it is required that the temperature inside the main reaction vessel 8 for the synthesis of whisker is not lower than 1130° C. being a boiling point of silicon sulfide. While, when the temperature is too high, the reaction of whisker formation hardly occurs, so that the upper limit is 1500° C. That is, the temperature inside the vessel 8 is within a range of 1130° to 1500° C.

In the fluidizied main reaction vessel 8 for the synthesis of whisker is arranged a heating means such as an electric furnace or the like in order to heat and hold the inside of the vessel at the above temperature range. Furthermore, the material of the vessel itself is desirable to be a heat resistant material such as alumina, mullite, silicon carbide or the like because the internal temperature becomes higher than 1130° C.

The carrier gas plays a role for controlling the concentrations of hydrogen sulfide blown from the bottom and silicon sulfide gas produced, and the gas flowing rate inside the main reaction vessel for the synthesis of whisker.

Furthermore, the carbon compound supplied to the main reaction vessel for the synthesis of whisker reacts with the silicon sulfide gas to form SiC, while the nucelus forming material floats in the main reaction vessel for the synthesis of whisker at a state of fine particles and serves as a nucleus or substrate for the deposition and growth of whisker. Therefore, the systhesized whisker grows utilizing the formed nucleus as a seed and is fluidized along the flowing of the carrier gas, silicon sulfide gas and the like to complete the reaction.

Figure 2:
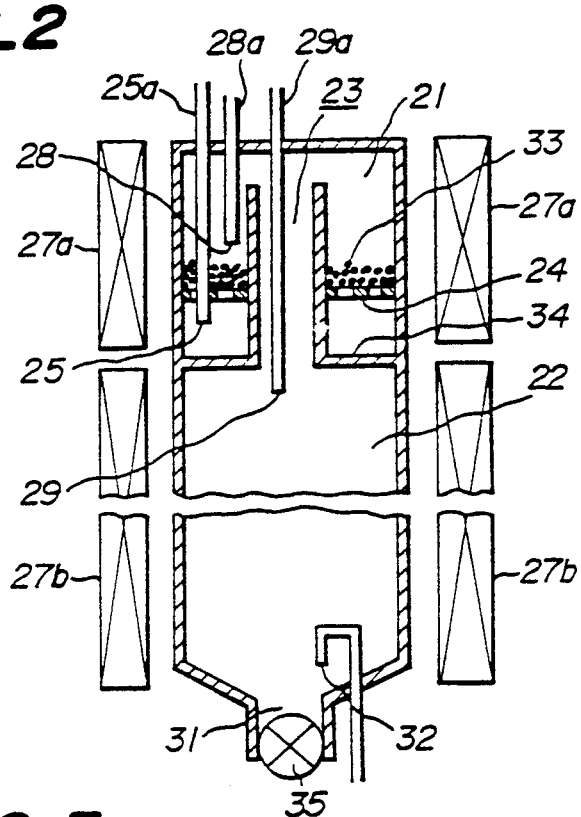

FIG. 2 shows concretely a main part of the apparatus according to the invention comprising the region for the production of silicon sulfide gas and the region for the synthesis of whisker as one-piece body, wherein a chamber 21 for the production of silicon sulfide gas is defined in an upper portion of the reaction vessel and a chamber 22 for the synthesis of SiC whisker is defined in a lower portion thereof separated through a partition 34 and a cylindrical gastransferring passage 23 communicating the chambers 21, 22 to each other ia arranged in a middle portion of the partition 34 so as to protrude upward therefrom.

In the silicon sulfide gas producing chamber 21 is arranged a porous gas distributing plate 24 for holding the charged metallic silicon particles (starting material) 33, while a gas inlet 25 for introducing hydrogen sulfide cotaining gas as a reaction gas is opened in a space beneath the gas distributing plate 24 through a pipe 25a for the gas introduction inserted from the upper portion of the vessel, and an inlet 28 for the supply of the starting material is opened in a space above the gas distributing plate 24 through a pipe 28a for the supply of the starting material inserted from the upper portion of the vessel.

In the SiC whisker synthesis chamber 22 is opened an inlet 29 for the supply of the carbon compound through a pipe 29a for the supply of the carbon compound arranged from the upper portion of the vessel. And also, a whisker through a ratary valve 35 discharge port 31 taking out the synthesized SiC whisker and a gas discharge port 32 for discharging hydrogen sulfide gas produced in the synthesis of SiC whisker and the unreacted gas are arranged in the bottom of the synthesis chamber.

Furthermore, heating means 27a and 27b capable of separately controlling the temperature are arranged in the silicon sulfide producing chamber 21 and the SiC whisker synthesis chamber 22.

FIGS. 3 to 6 shows another concrete embodiments comprising the above regions as a one-piece body, respectively, which are modified embodiments on the arrangement of silicon sulfide producing chamber 21 and SiC whisker synthesis chamber 22, the arrangement of the gas transferring passage 23 and the arrangement of the gas inlet pipe 25a.

Figure 3:
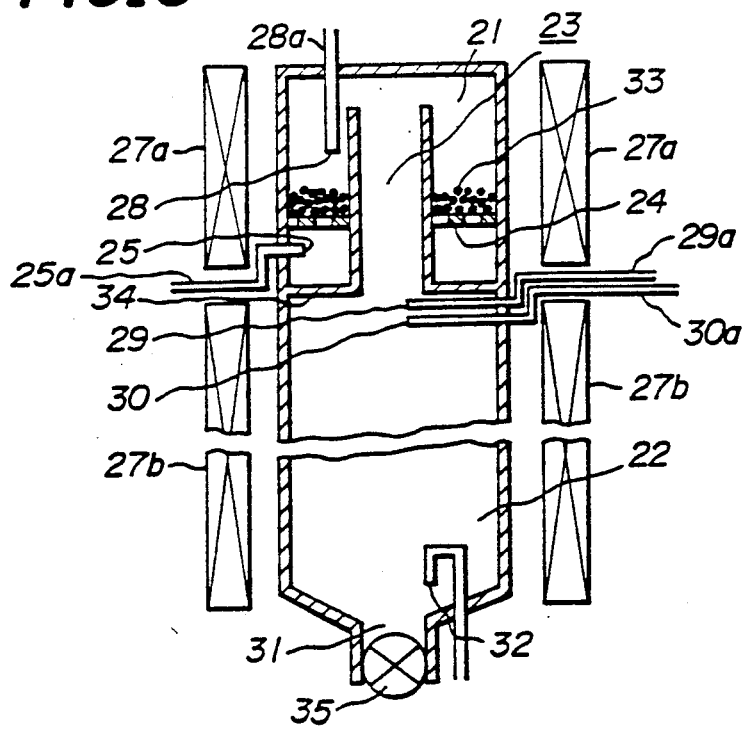

The apparatus shown in FIG. 3 comprises the silicon sulfide producing chamber 21 defined and formed in the upper portion of the vessel, and the SiC whisker synthesis chamber 22 defined and formed in the lower portion of the vessel through a partition 34, and is the same as in the embodiment of FIG. 2 in a point that a cylindrical gas transferring passage 23 communicating both the above chambers 21, 22 to each other is arranged in the middle portion of the partition 34 so as to protrude upward therefrom.

A point different from the embodiment of FIG. 2 lies in the arrangement of hydrogen sulfide containing gas inlet 25 having an opening beneath the gas distributing plate 24, that is, the gas inlet 25 for introducing the hydrogen sulfide containing gas as a reaction gas is arranged through a gas inlet pipe 25a inserted into the chamber from the side portion of the vessel. On the other hand, the inlet for the supply of the carbon compound having an opening in the SiC whisker synthesis chamber 22 is opened through a carbon compound supply pipe 29a arranged in the side portion of the vessel. Furthermore, an inlet 30 for the supply of the nucleus forming material used in the invention, if necessary, is arranged in this embodiment. This inlet 30 is formed through a nucleus forming material supply pipe 30a arranged in the side portion of the vessel. The other structure is the same as in FIG. 2.

Figure 4:
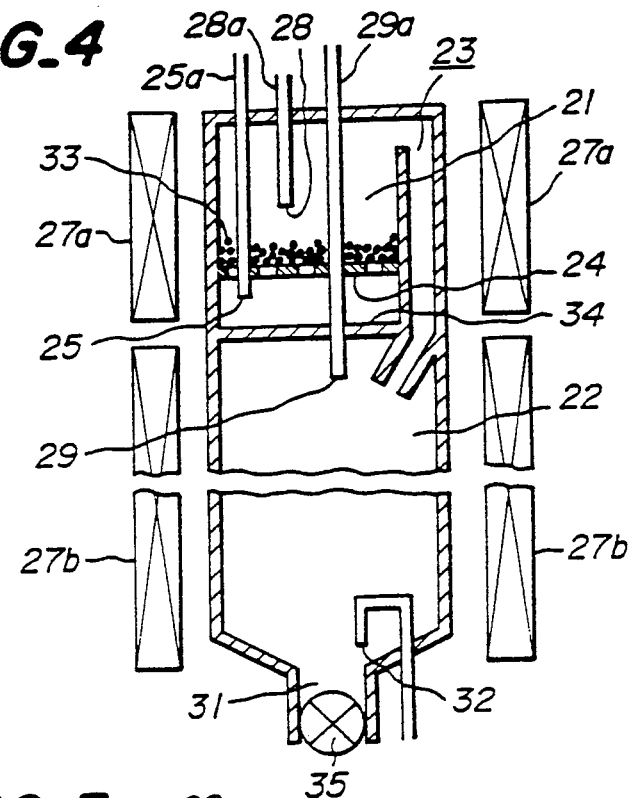

The apparatus shown in FIG. 4 comprises the silicon sulfide gas producing chamber 21 defined and formed in the upper portion of the vessel and the SiC whisker synthesis chamber 22 defined and formed in the lower portion of the vessel through a partition 34, wherein a cyclindrical transferring passage 23 communicating both the above chambers 21, 22 to each other is arranged in the peripheral portion of the partition 34 so as to protrude upward therefrom.

A point different from the apparatus of FIG. 2 lies in that the transferring passage 23 does not locate in the middle portion but located in the peripheral portion. Therefore, the carbon compound supply inlet 29 having an opening in the SiC whisker synthesis chamber 22 is arranged through a pipe 29a inserted from the upper portion of the vessel so as to pass through the silicon sulfide producing chamber 21. There is no dofference in the other structure.

Figure 5:
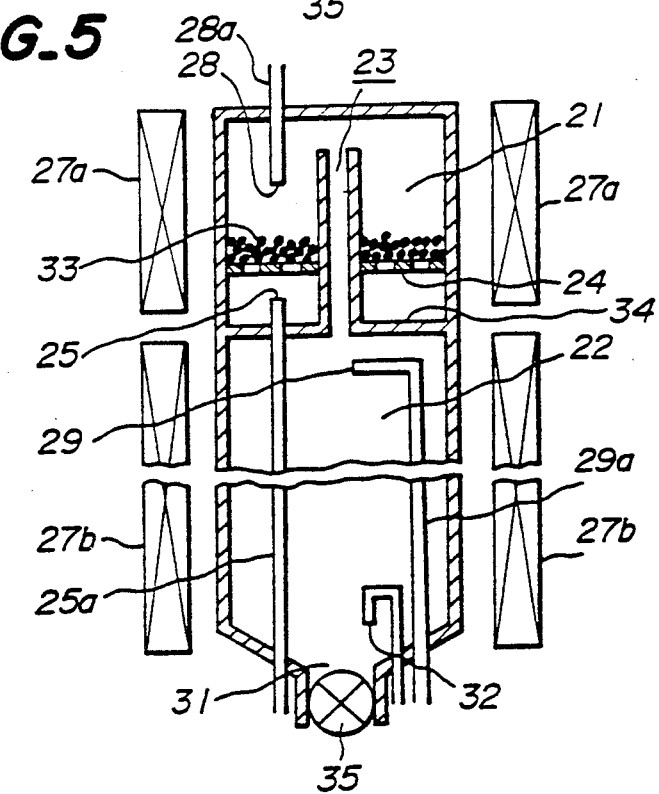

The apparatus shown in FIG. 5 comprises the silicon sulfide producing chamber 21 defined and formed in the upper portion of the vessel, and the SiC whisker synthesis chamber 22 defined and formed in the lower portion of the vessel through a partition 34, and is the same as in the embodiment of FIG. 2 in a point that a cylindrical transferring passage 23 communicating both the above chambers 21, 22 to each other is arranged in the middle portion of the partition 34 so as to protrude upward therefrom.

The difference of the structure between both apparatuses lies in the arrangement of the gas inlet 25 and carbon compound supply port 29. That is, the gas inlet 25 is opened beneath the gas distributing plate 24 through the gas inlet pipe 25a inserted from the lower portion of the vessel so as to pass through the SiC whisker synthesis chamber 22, while the carbon compound supply port 29 is opened above the SiC whisker synthesis chamber 22 through the carbon compound supply pipe 29a inserted from the lower portion of the vessel into the chamber. The other structure is the same as in the apparatus of FIG. 2.

The apparatus shown in FIG. 6 comprises the silicon sulfide gas producing chamber 21 defined and formed in the lower portion of the reaction vessel and the SiC whisker synthesis chamber 22 defined and formed in the upper portion thereof through a partition 34, wherein a cylindrical transferring passage 23 communicating both the above chambers 21, 22 to each other is arranged in the peripheral portion of the partition 34 so as to protrude upward therefrom.

To the silicon sulfide gas producing chamber 21 located in the lower portion is attached a gas distributing plate 24 for holding the charged metallic silicon particles (starting material) 33. Beneath the gas distributing plate 24 is opened the gas inlet 25 for introducing the hydrogen sulfide containing gas through the gas inlet pipe 25a inserted from the lower portion of the vessel, while a port 28 for the supply of the starting material is similarly opened above the gas distributing plate 24 through the starting material supply pipe 28a arranged from the side portion of the vessel. Furthermore, the inlet 29 for the supply of the carbon compound is opened in the SiC whisker synthesis chamber 22 located in the upper portion through the carbon supply pipe 29a arranged from the upper portion of the vessel. Moreover, a discharge port 31 taking out the synthesized SiC whisker is arranged in the side portion of the SiC whisker synthesis chamber 22 located in the upper portion, and a gas discharge port 32 for discharging hydrogen sulfide gas produced in the synthesis of SiC whisker and the unreacted gas is arranged in the bottom of the synthesis chamber 22. In addition, heating means 27a and 27b capable of separately controlling the temperature are arranged in the silicon sulfide gas producing chamber 21 and the SiC whisker synthesis chamber 22.

Moreover, in the embodiments of FIGS. 2 to 6, the first stage is a step in which the metallic silicon 33 as a starting material charged into the silicon sulfide gas producing chamber 21 is contacted with the hydrogen sulfide containing gas to generate silicon sulfide gas. The metallic silicon 33 is continuously or intermittently charged into the silicon sulfide gas producing chamber 21 through the starting material supply inlet 28. The silicon sulfide gas producing chamber 21 occupying in a part of the reaction vessel is provided with the trasferring passage 23 as a discharge port for the production gas and the inlet 25 for the hydrogen sulfide containing gas above and beneath the gas distributing plate 24 inserted therein, and the metallic silicon 33 is deposited and held on the gas distributing plate 24. Moreover, the metallic silicon 33 is charged into the silicon sulfide gas producing chamber 21 through the starting material supply inlet 28. Even in these apparatuses (FIGS. 2 to 6), the same metallic silicon as mentioned above is used.

After the charge of the metallic silicon as a starting material, the hydrogen sulfide containing gas is introduced into the silicon sulfide gas producing chamber 21 through the inlet 25 for the hydrogen sulfide containing gas opened therein and passed through the deposited layer of the metallic silicon 33 to cause the catalytic reaction, whereby the silicon sulfide gas is generated and then transferred to the subsequent SiC whisker synthesis chamber 22 at a warmed state ($>1000°$ C.) through the gas transferring passage 23 as a production gas discharge port arranged in the silicon sulfide gas producing chamber 21.

In the apparatuses of FIGS. 2 to 6, in order to generate the silicon sulfide gas in the silicon sulfide gas producing chamber 21 of the first stage, it is desirable to maintain the temperature inside the vessel within a range of 1000° to 1400° C. owing to the aforementioned reasons. Therefore, it is required to dispose the heating means 27a such as an electric furnace or the like in the silicon sulfide gas producing chamber 21 and the transferring passage 23 for transferring the silicon sulfide gas so as to hold the inside temperature within a range of 1000° to 1400° C.

Moreover, as the hydrogen sulfide containing gas, use may be made of hydrogen sulfide alone or a mixture with an inert gas such as argon, helium or the like, a reducing gas such as hydrogen or the like or a mixed gas thereof.

Then, the second stage according to the invention is a step in which the silicon sulfide gas produced in the first stage is introduced into a chamber defined and formed in the same reaction vessel, i.e. SiC whisker synthesis chamber 22 maintained at a temperature range of 1130° to 1500° C. through the heating means, while the carbon compound is supplied to the synthesis chamber 22 through the carbon compound supply pipe 29a, and both the compounds are contacted with each other in the SiC whisker synthesis chamber 22 to deposit and grow the whisker. In this case, the nucleus forming material may be supplied through the inlet 30 for the nucleus forming material, if necessary, likewise the case of FIG. 1. Moreover, the carbon compound and the nucleus forming material used, if necessary, are the same as in the embodiment of FIG. 1.

At the first stage, the content of hydrogen sulfide in the hydrogen sulfide containing gas blown into the silicon sulfide gas producing chamber 21 is adjusted by the inert gas or the reducing gas or the mixed gas thereof. Further, such an adjustment enables the adjustment of the concentration of the produced silicon sulfide gas and hence can control the gas flowing rate in the SiC whisker synthesis chamber 22.

The carbon compound supplied to the SiC whisker synthesis chamber 22 acts to react with the silicon sulfide gas to synthesize SiC, and gradually deposits and grows SiC whisker utilizing the sidewall of the synthesis chamber 22 as a medium (substrate).

The nucleus forming material supplied at this stage, if necessary, floats in form of microparticles in the SiC whisker synthesis chamber 22 and serves as a nucleus or substrate for the deposition and growth of SiC whisker. Therefore, the produced SiC whisker produces using the produced nucleus as a seed and successively fluidizes along the flowing of the silicon sulfide gas or the like and gradually grows to complete the reaction.

The invention will be described with reference to an example for the production of SiC whisker based on each of the illustrated apparatuses.

(1) Example in the apparatus of FIG. 1;

The fluidized preliminary reaction vessel 1 for the production of silicon sulfide gas was made of silicon carbide and was cylindrical with an inner diameter of 150 mm and a length of 1000 mm, while the fluidized main reaction vessel 8 for the synthesis of SiC whisker was made of silicon carbide and was cylindrical with an inner diameter of 300 mm and a length of 3000 mm. Each of these vessels 1, 8 was placed in electric furnaces 7a to 7c.

Into the preliminary reaction vessel 1 for the production of silicon sulfide held at 1200° C. in its inside was charged metallic silicon having an average particle size of 0.3 mm, while hydrogen sulfide gas and hydrogen gas were blown from the bottom thereof through the inlets 5, 6. The total flow amount of hydrogen sulfide gas and hydrogen gas was 204 ml/s and a ratio thereof was 5:95.

The generated silicon sulfide gas was transferred into the main reaction vessel 8 for the synthesis of SiC whisker held at 1300° C. in its inside, and at the same time propylene gas of 4 ml/s and ferrocene gas of $2 \times 10^{-3}$ ml/s were introduced from the upper portion of the vessel 8 thereinto. These gases were continuously supplied at the above constant amounts. The deposited and grown whisker was discharged and recovered from the whisker discharge port 12 arranged in the bottom of the main reaction vessel 8 through a rotary valve 14 while sealing the gas. The thus obtained whisker was analyzed by an X-ray and further the length and size thereof were measured by a microscope. Further, the yield of the whisker was calculated from the weight of whisker obtained per unit time and the weight of propylene gas charged. These results are shown in the following Table 1.

Examples 1 to 4 shown in this Table are production examples when changing amounts of hydrogen sulfide gas, hydrogen gas, propylene gas and ferrocene gas used and the temperature inside the preliminary reaction vessel 1 for the production of silicon sulfide gas and the main reaction vessel 8 for the synthesis of whisker.

TABLE 1

| | Example 1 | Example 2 | Example 3 | Example 4 |
|---|---|---|---|---|
| Total blowing amount of hydrogen sulfide and hydrogen (ml/s) | 204 | 199 | 416 | 150 |
| Mixing ratio of hydrogen sulfide to hydrogen | 5:95 | 10:90 | 10:90 | 15:85 |
| Blowing amount of propylene (ml/s) | 4 | 9 | 18 | 16 |
| Amount of ferrocene charged (ml/s) | $2 \times 10^{-3}$ | $3 \times 10^{-3}$ | $5 \times 10^{-3}$ | $8 \times 10^{-3}$ |
| Temperature inside preliminary reaction vessel (°C.) | 1200 | 1200 | 1200 | 1300 |
| Temperature inside main reaction vessel (°C.) | 1300 | 1270 | 1270 | 1360 |

TABLE 1-continued

| | Example 1 | Example 2 | Example 3 | Example 4 |
|---|---|---|---|---|
| Average size of whisker (μ) | 0.3 | 0.2 | 0.2 | 0.5 |
| Average length of whisker (μ) | 187 | 215 | 96 | 151 |
| Yield (%) | 73 | 64 | 61 | 55 |
| Crystal form | β type | β type | β type | β type |

Note
The flowing amount of each gas used is an amount converted at 25° C.

(2) Example in the apparatus of FIG. 2;

Metallic silicon having an average particle size of 0.5 mm was charged onto the gas distributing plate 24 inside the silicon sulfide gas producing chamber 21 held at 1200° C. in its inside, while the hydrogen sulfide containing gas was blown at a given amount through the gas inlet 25. As the hydrogen sulfide containing gas, a mixture of hydrogen sulfide gas and hydrogen gas was used.

The generated silicon sulfide gas was transferred into the SiC whisker synthesis chamber 22 held at 1300° C. in its inside through the gas transferring passage 23 at a warmed state, while propylene gas as a carbon compound and, if necessary, ferrocene gas as a nucleus forming material were introduced into the SiC whisker synthesis chamber 22 at given amounts, respectively. Moreover, these gases were continuously supplied at given amounts.

The deposited and grown SiC whisker was discharged and recovered from the whisker discharge port 31 arranged in the bottom of the whisker synthesis chamber 22 through a rotary valve 35 while sealing gas. The thus obtained SiC whisker was analyzed by an X-ray, and further the length, size and the like were measured by a microscope. Further, the yield of SiC whisker was calculated from the weight of whisker obtained per unit time and the weight of propylene gas charged. These results are shown in the following Table 2. Moreover, Examples 5 to 8 are production examples when changing the amount of hydrogen sulfide containing gas, content of hydrogen sulfide, amounts of propylene and ferrocene used and temperature inside the silicon sulfide gas producing chamber 21 and the SiC whisker synthesis chamber 22.

TABLE 2

| | Example 6 | Example 7 | Example 8 | Example 9 |
|---|---|---|---|---|
| Amount of hydrogen sulfide containing gas charged (ml/s) | 478 | 486 | 972 | 246 |
| Content of hydrogen sulfide (%) | 5 | 10 | 10 | 20 |
| Amount of propylene charged (ml/s) | 25 | 28 | 56 | 31 |
| Amount of ferrocene charged (ml/s) | 0 | 0 | 0 | $9 \times 10^{-3}$ |
| Temperature inside silicon sulfide gas producing chamber (°C.) | 1200 | 1200 | 1200 | 1250 |
| Temperature inside whisker synthesis chamber (°C.) | 1300 | 1270 | 1270 | 1360 |
| Average size of whisker (μ) | 0.2 | 0.3 | 0.2 | 0.4 |
| Average length of whisker (μ) | 381 | 352 | 276 | 137 |
| Yield (%) | 62 | 59 | 58 | 53 |

TABLE 2-continued

|  | Example 6 | Example 7 | Example 8 | Example 9 |
|---|---|---|---|---|
| Crystal form | β type | β type | β type | β type |

Note
The flowing amount of each gas used is an amount converted at 25° C.

As seen from the above explanation and results of the examples, when SiC whisker is produced by using the apparatus according to the invention in the method as mentioned above, high quality SiC whisker can continuously and efficiently be produced.

Particularly, according to the invention, the concentration and amount of silicon sulfide gas produced can be controlled by changing the amount of hydrogen sulfide containing gas charged into the silicon sulfide gas producing chamber and the content of hydrogen sulfide, and further the whisker can continuously be produced with the controlling of its amount, length, size and the like by changing the amounts od the starting material and hydrogen sulfide containing gas and the temperature inside each chamber.

Furthermore, according to the invention, the nucleus forming material can be used, if necessary. If this material is used, the produced whisker grows utilizing fine particles of the nucleus forming material existent at a floating state in the whisker synthesis chamber as a nucleus, so that the forming conditions can be uniformized and consequently SiC whisker having high uniformity on the length, size and the like is continuously obtained as compared with SiC whisker grown using the surface of the fixed substrate as a nucleus.

INDUSTRIAL APPLICABILITY

As mentioned above, according to the invention, the starting material as Si source is metallic silicon and silicon sulfide gas is cheap as compared with the silicon halide gas used in the conventional technique, so that cheap whisker can finally be supplied, which is favorably used as a material for composite reinforcement such as FRP, FRM, FRC or the like.

We claim:
1. A method of producing SiC whisker through vapor phase synthesis of silicon sulfide and carbon compound by using an apparatus for the production of SiC whisker being a combination of a vessel for the production of silicon sulfide gas provided with a gas distributing plate, an inlet for metallic silicon and an outlet for silicon sulfide gas located above the gas distributing plate, and inlets for hydrogen sulfide gas and a carrier gas beneath the gas distributing plate, and a vessel for the synthesis of SiC whisker communicated with a supply pipe for the supply of a nucleus forming material and the supply of a carbon compound and provided with an outlet for the discharge of a whisker, comprising successively charging metallic silicon into a temperature atmosphere range of 1000° to 1400° C., blowing hydrogen sulfide gas and carrier gas thereinto to produce a silicon sulfide gas, discharging the resulting silicon sulfide gas from the outlet and introducing it into said vessel for the synthesis of SiC whisker held at 1130° to 1500° C. together with the carrier gas and contacting said silicon sulfide gas with a carbon compound supplied from the supply pipe in the presence of a nucleus forming material provided by the supply pipe; said carbon compound being selected from paraffinic hydrocarbons such as methane, ethane, propane, butane, pentane; olefin hydrocarbons such as ethylene, propylene, butylene, amylene; acetylentic hydrocarbons such as acetylene, allylene, butylene; aromatic hydrocarbons such as benzene, naphthalene, antracene; alicyclic hydrocarbons such as cycloparaffin, cycloolefin, and said nucleus forming material being selected from the group consisting of metals selected from iron, nickel, titanium, manganese, cobalt, copper, vanadium, chromium, aluminum and silicon or their oxides, carbides, nitrides, sulfides, halides, sulfates, nitrates and alcoholates, organometallic compounds represented by the formula $M(C_2H_5)_2$ (wherein M is a metal selected from Fe, Ni, Ti, Mn, Co, Cu, V and CR) and a mixture thereof; wherein whiskers are grown at a floating state and then continuously or intermittently discharged from said outlet.

* * * * *